(12) United States Patent
Lucero et al.

(10) Patent No.: US 8,242,623 B2
(45) Date of Patent: Aug. 14, 2012

(54) STRUCTURAL RING INTERCONNECT PRINTED CIRCUIT BOARD ASSEMBLY FOR A DUCTED FAN UNMANNED AERIAL VEHICLE

(75) Inventors: Michael Lucero, Albuquerque, NM (US); Daniel Ross Collette, Albuquerque, NM (US); David Axtman, Albuquerque, NM (US)

(73) Assignee: Honeywell International Inc., Morristown, NJ (US)

( * ) Notice: Subject to any disclaimer, the term of this patent is extended or adjusted under 35 U.S.C. 154(b) by 756 days.

(21) Appl. No.: 12/270,196

(22) Filed: Nov. 13, 2008

(65) Prior Publication Data

US 2010/0120273 A1    May 13, 2010

(51) Int. Cl.
*H01R 12/00* (2006.01)
(52) U.S. Cl. ........................................ 307/9.1
(58) Field of Classification Search .................... 307/9.1
See application file for complete search history.

(56) References Cited

U.S. PATENT DOCUMENTS

| | | | |
|---|---|---|---|
| 2,195,343 A | | 3/1940 | Sayre |
| 3,456,280 A | | 7/1969 | Brown et al. |
| 3,919,597 A | * | 11/1975 | Meacham ..................... 315/382 |
| 4,654,745 A | * | 3/1987 | Corby .......................... 361/171 |
| 4,795,111 A | * | 1/1989 | Moller ......................... 244/23 C |
| 4,979,544 A | | 12/1990 | Swindlehurst |
| 5,220,488 A | | 6/1993 | Denes |
| 5,618,183 A | * | 4/1997 | Gilmore et al. ................. 439/66 |
| 5,676,334 A | * | 10/1997 | Cotton et al. .............. 244/17.13 |
| 5,869,907 A | | 2/1999 | Marler |
| 6,291,770 B1 | | 9/2001 | Casperson |
| 6,392,317 B1 | | 5/2002 | Hall et al. |
| 6,450,445 B1 | * | 9/2002 | Moller ......................... 244/23 A |
| 6,770,818 B1 | | 8/2004 | Puchegger |
| 6,868,314 B1 | * | 3/2005 | Frink ................................. 701/3 |
| 7,137,196 B2 | | 11/2006 | Gunderson et al. |
| 7,255,623 B2 | * | 8/2007 | Davis .......................... 244/23 C |
| 7,326,089 B2 | | 2/2008 | Hashim |
| 2002/0161929 A1 | | 10/2002 | Longerbeam et al. |
| 2004/0094662 A1 | * | 5/2004 | Sanders et al. ............... 244/12.5 |
| 2005/0257957 A1 | | 11/2005 | Vasoya |
| 2007/0221790 A1 | * | 9/2007 | Goossen et al. ............ 244/53 B |
| 2008/0210809 A1 | * | 9/2008 | Arlton et al. .............. 244/17.11 |
| 2010/0120273 A1 | * | 5/2010 | Lucero et al. ................... 439/79 |

FOREIGN PATENT DOCUMENTS

EP        1 162 400 A2    12/2001

OTHER PUBLICATIONS

European Search Report, from corresponding EP Application No. 09169192.3, mailed Oct. 21, 2011, 3 pages.
European Examination Report, from corresponding EP Application No. 09169192.3, mailed Nov. 3, 2011, 5 pages.
Reply to communication from the Examining Division, for EP Application No. 09169192.3, dated May 2, 2012, 13 pages.

* cited by examiner

*Primary Examiner* — Fritz M Fleming
(74) *Attorney, Agent, or Firm* — Shumaker & Sieffert, P.A.

(57) ABSTRACT

A structural ring interconnect printed circuit board assembly for a ducted fan unmanned aerial vehicle that comprises a printed circuit board attached to a core vehicle body, wherein the printed circuit board conforms to the shape of the core vehicle body's airframe skirt, and wherein the printed circuit board provides structural integrity to the core vehicle body.

20 Claims, 4 Drawing Sheets

STRUCTURAL RING INTERCONNECT PRINTED CIRCUIT BOARD ASSEMBLY FOR A DUCTED FAN UNMANNED AERIAL VEHICLE

GOVERNMENT RIGHTS

The United States government may have certain rights in this invention pursuant to Government Contract #W56HZV-05-C-0724 with the U.S. Army (TACOM).

BACKGROUND OF THE INVENTION

In aerospace applications, it is typical to use wire harnesses as interconnects in electrical systems. However, these harnesses are often bulky, heavy, costly to build and maintain, and subject to corrosion and other defects. Further, with the advent of modular ducted fan unmanned aerial vehicles (UAVs), the ducted wing is comprised of multiple pods that require a system allowing for quick disconnect and replacement of pods around the circumference of a core vehicle. Particularly with respect to micro-air vehicle UAVs, the wire harness configuration and resultant connectors are cumbersome and weigh too much when placed around the circumference of the duct to connect to each pod. These wire harnesses do not provide structural integrity to the UAV and additional material must be used to thicken walls and bulkheads, for example, to provide such support. This additional material necessarily adds more weight to the UAV assembly. In addition, the wire harnesses are frequently modified at a significant cost to accommodate changes in these various pods.

Printed circuit boards (PCBs), on the other hand are rugged, inexpensive, and highly reliable. PCBs provide both the physical structure for mounting and holding electronic components as well as the electrical interconnection between components. A PCB consists of a non-conducting substrate, known as prepreg, upon which a conductive pattern or circuitry is formed. The most common type of prepreg is fiberglass with epoxy resin. Prepreg is available in different styles with varying amounts of resin and glass fibers, which allows the manufacturer to control the thickness between the layers and to provide the appropriate amount of resin flow between circuitry. Copper is the most prevalent conductor, although nickel, silver, tin, tin-lead, and gold may also be used as etch resists or top-level metal. Multilayer PCBs consist of alternating layers of conductor and insulating material bonded together. The conductive layers are connected by plated through-holes, which are also used to mount and electrically connect components. PCBs may be either rigid, flexible, or a combination of the two known as a rigid-flex.

SUMMARY OF THE INVENTION

PCBs are employed most often as backplanes or motherboards in standard home computers, which is essentially a large circuit board that contains sockets for expansion cards. These former PCBs were simply delicate components in an operating system that played no role with regard to the overall structural integrity of the device. In the present invention, the backplane is specifically designed to provide structural integrity to the UAV. For example, the backplane's edges are contoured to fit the shape of the core vehicle's outer shell and the backplane is integrated into the UAV to prevent warping of the core body due to bending moments. The backplane also provides a lightweight surface to bear the weight of the pods that join together to form the UAV's duct. Further, the use of the multilayer PCB in a ducted fan UAV allows for impedance matching and offers electromagnetic interference shielding for conductors. In addition, the backplane of the present invention allows straightforward redesigns to accommodate various pods, which would be inexpensive and quick compared with wire harness redesign.

The discovery presented herein outlines a structural ring interconnect printed circuit board assembly for a ducted fan unmanned aerial vehicle (UAV) that has the beneficial effects of providing structural integrity to the core vehicle body, providing a lightweight supporting surface for the UAV's pods, and providing quick and inexpensive redesign options.

In a first aspect, the present invention provides a structural ring interconnect printed circuit board assembly for a ducted fan unmanned aerial vehicle that comprises a printed circuit board attached to a core vehicle body, wherein the printed circuit board conforms to the shape of the core vehicle body's airframe skirt, and wherein the printed circuit board provides structural integrity to the core vehicle body.

In a second aspect, the present invention provides a structural ring interconnect printed circuit board assembly for a ducted fan unmanned aerial vehicle that comprises a plurality of printed circuit boards attached to a core vehicle body, wherein each of the plurality of printed circuit boards conforms to the shape of the core vehicle body's airframe skirt, and wherein each of the plurality of the printed circuit boards provides structural integrity to the core vehicle body.

DETAILED DESCRIPTION OF THE PREFERRED EMBODIMENT

In a first aspect, the present invention provides a structural ring interconnect printed circuit board assembly 10 for a ducted fan unmanned aerial vehicle (UAV) that comprises a printed circuit board 12 attached to a core vehicle body 14, wherein the printed circuit board 12 conforms to the shape of the airframe skirt 16 of the core vehicle body, and wherein the printed circuit board 12 provides structural integrity to the core vehicle body 14.

As used herein, a printed circuit board (PCB) 12 provides the physical structure for mounting and holding electronic components as well as the electrical interconnection between components. The PCB 12 consists of a non-conducting substrate, known as prepreg, upon which a conductive pattern or circuitry is formed. The most common type of prepreg is fiberglass with epoxy resin. Prepreg is available in different styles with varying amounts of resin and glass fibers, which allows the manufacturer to control the thickness between the layers and to provide the appropriate amount of resin flow between circuitry. Copper is the most prevalent conductor, although nickel, silver, tin, tin-lead, and gold may also be used as etch resists or top-level metal. Multilayer PCBs consist of alternating layers of conductor and insulating material bonded together. The conductive layers are connected by plated through-holes, which are also used to mount and electrically connect components. PCBs 12 may be either rigid, flexible, or a combination of the two known as a rigid-flex.

Figure 1B:
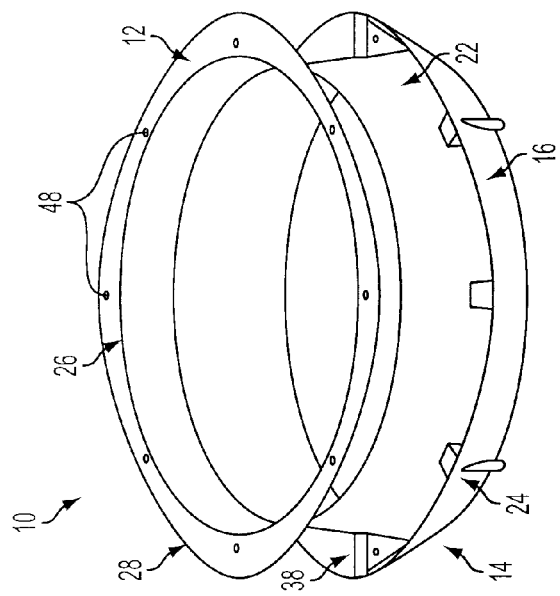
FIG. 1b is a perspective view of the v-blocks in place within the airframe skirt prior to attaching the structural ring interconnect printed circuit board assembly according to one embodiment.
Figure 1C:
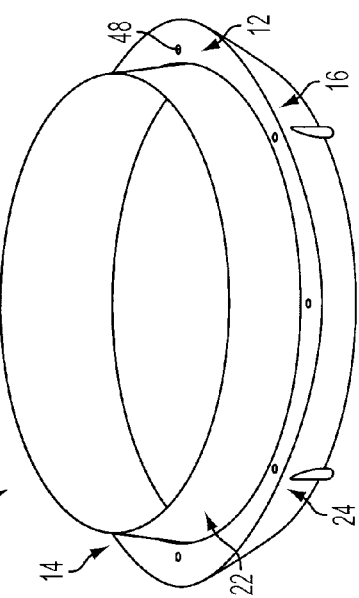
FIG. 1c is a perspective view of the structural ring interconnect printed circuit board assembly after attachment to the airframe skirt and v-blocks according to one embodiment.
Figure 1A:
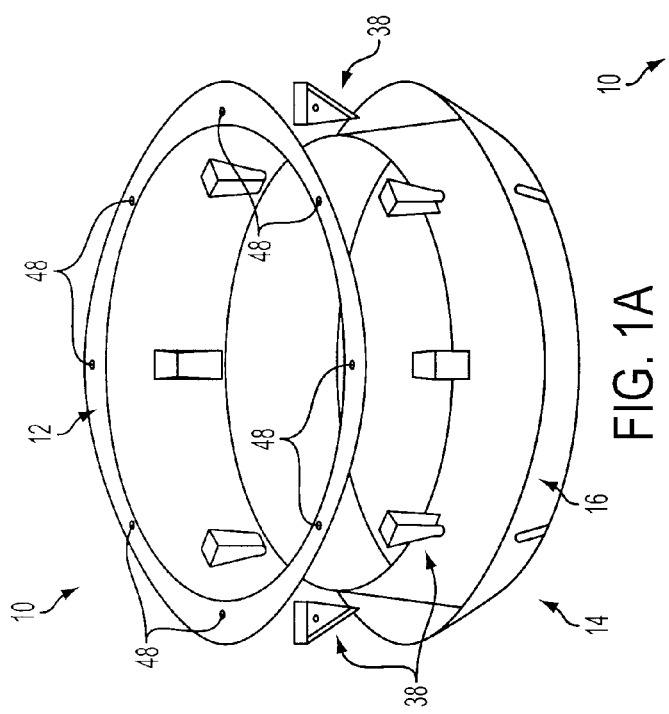
FIG. 1a is a perspective view of the structural ring interconnect printed circuit board, v-blocks, and the airframe skirt prior to attachment according to one embodiment.

As used herein, a core vehicle body 14 is the unitary portion of the ducted fan UAV, shown in FIGS. 1a-1c. Pods 18 connect to the core vehicle 14 to form a complete duct on a UAV. As used herein, pods 18 are streamlined, detachable housings that may contain various payloads, such as weapons or fuel. The arrangement of the various pods 18 relative to one another is limited only by the location of the connectors 20 on the core vehicle 14, the desired center of gravity, and other basic operating parameters.

As used herein, the airframe skirt 16 of the core vehicle body 14 forms the lower portion of the duct on a UAV, shown in FIGS. 1a-1c. The airframe skirt 16 is preferably substantially v-shaped such that when a pod 18 is connected to the airframe skirt 16 the profile or cross-section of the resulting duct is in accordance with standard streamlined profiles known in the art. As shown in FIGS. 1a-1c, the inner wall 22 of the airframe skirt is typically taller than the outer duct wall 24 of the airframe skirt. As detailed below, the PCB 12 is inserted onto and/or into the airframe skirt 16 at the opening of the top of the "V" and is attached to the airframe skirt 16 via screws, rivets, glue, or a combination of these, for example, or by any other attachment means known in the art. The PCB 12 is preferably mounted within the airframe skirt 16. Alternatively, the PCB 12 may be mounted on top of the airframe skirt 16, which would generally be used for those embodiments in which the PCB 12 is a single layer or multilayer that is still relatively thin such that a smooth transitional surface is provided between the pods 18 and the airframe skirt 16. In another embodiment the PCB 12 may contain one or more layers that rest on top of the outer duct wall 24 of the airframe skirt 16 coupled with one or more PCB layers that fit within the airframe skirt 16, essentially providing a PCB 12 with a top lip (not shown) running along the PCB's outer edge 28. This outer lip would aide in alignment of the PCB 12 with the airframe skirt 16 prior to and during attachment.

As used herein, the PCB 12 conforms to the shape of the airframe skirt 16 of the core vehicle body 14 such that the PCB's inner and outer edges 26, 28 are contoured to substantially mate with both sides of the airframe skirt's v-shell 16 along the PCB's entire arc length. With respect to the layer or layers of PCB that rest on top of the airframe skirt 16, the PCB's outer edge 28 substantially matches the outer perimeter of the outer duct wall 24 of the airframe skirt 16 to create a smooth transition between the two, while the PCB's inner edge 26 essentially abuts the inner wall 22 of the airframe skirt 16. With respect to the layer or layers of PCB that rest within the airframe skirt 16, the PCB's outer edge 28 essentially abuts the outer duct wall 24 of the airframe skirt 16, while the PCB's inner edge 26 essentially abuts the inner wall 22 of the airframe skirt 16. Therefore, embodiments using multilayer PCBs 12 require that the shape of the PCB 12 will taper according to the aerodynamic taper of the airframe skirt 16. By configuring the PCB 12 in this manner, the outer and inner walls 24, 22 of the airframe skirt 16 are reinforced and they can better resist bending moments. The PCB 12 also provides structural stability so that a major component, like the engine, can be mounted to the inner wall 22 of the airframe skirt 16.

Figure 2B:
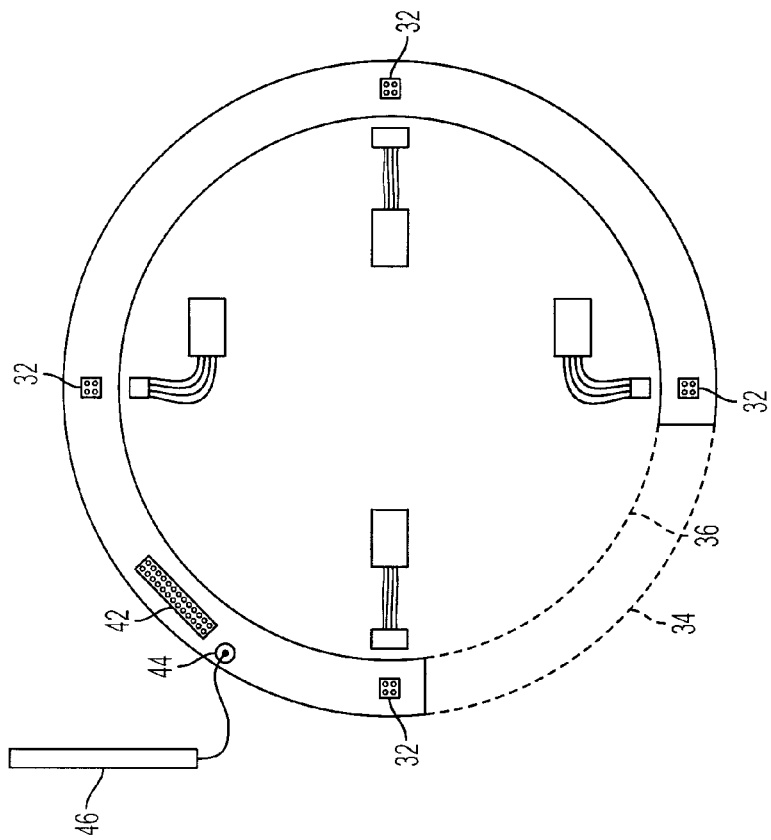
FIG. 2b is a bottom view of the printed circuit board according to one embodiment.
Figure 2A:
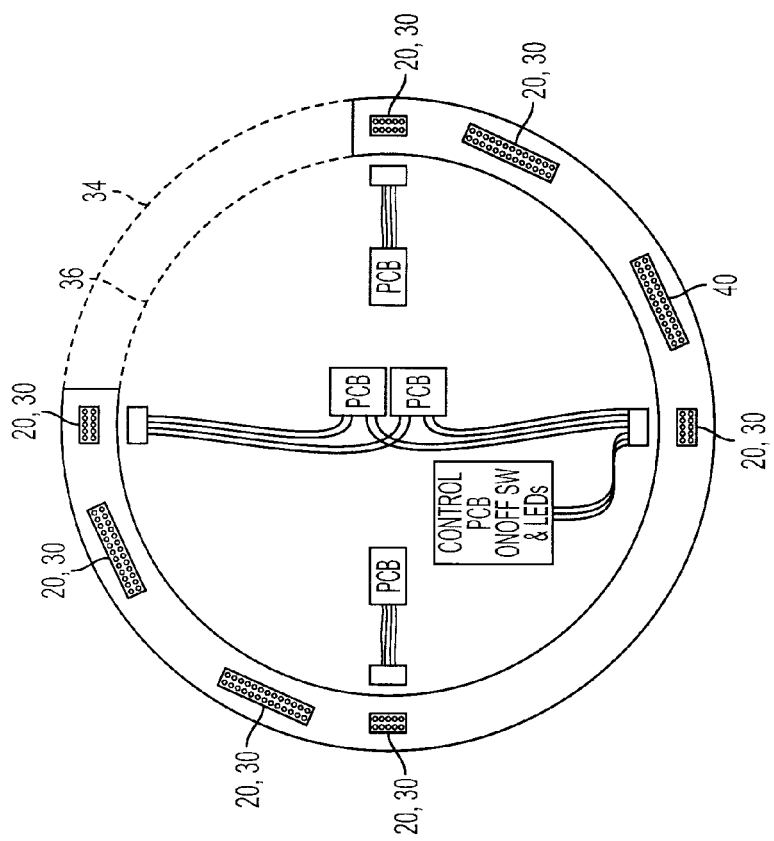
FIG. 2a is a top view of the printed circuit board according to one embodiment.
Figure 3B:
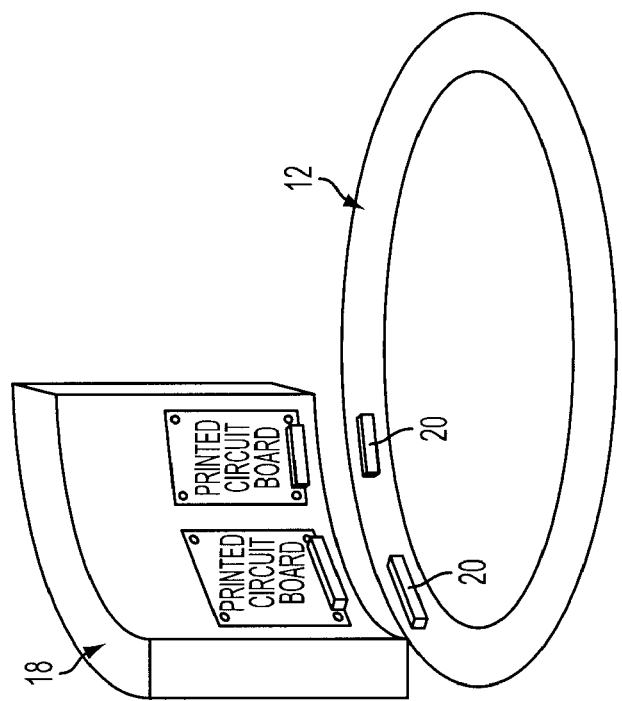
FIG. 3b is a perspective view of the structural ring interconnect printed circuit board separated from a pod containing printed circuit boards with card-edge connectors according to one embodiment.
Figure 3A:
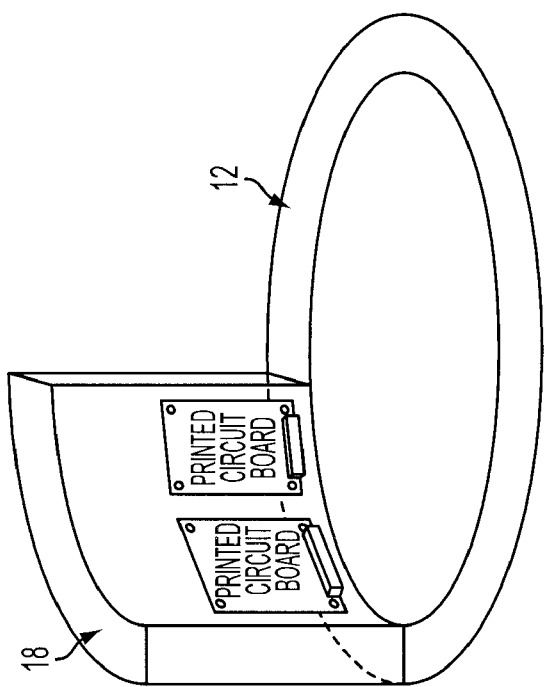
FIG. 3a is a perspective view of the structural ring interconnect printed circuit board connected to a pod containing printed circuit boards with card-edge connectors according to one embodiment.
Figure 3D:
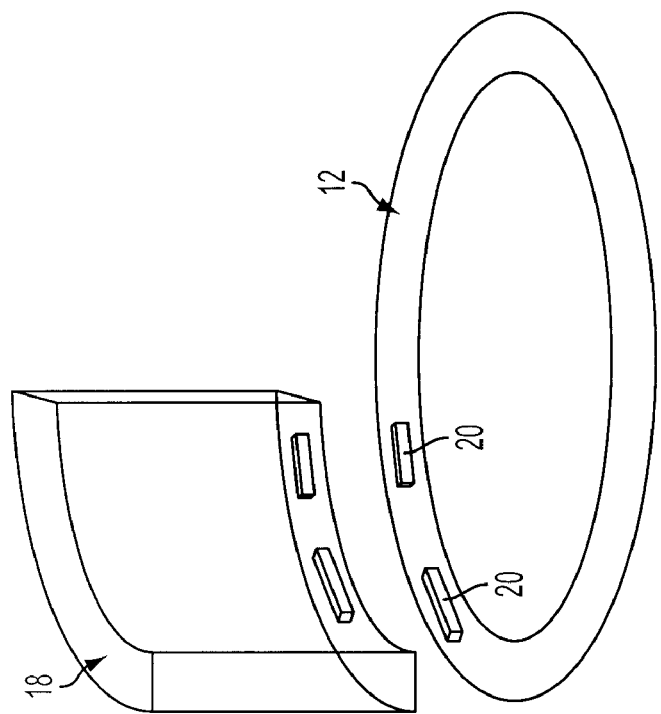
FIG. 3d is a perspective view of the structural ring interconnect printed circuit board separated from a pod with a printed circuit board and connectors attached on the pod's bottom side according to one embodiment.
Figure 3C:
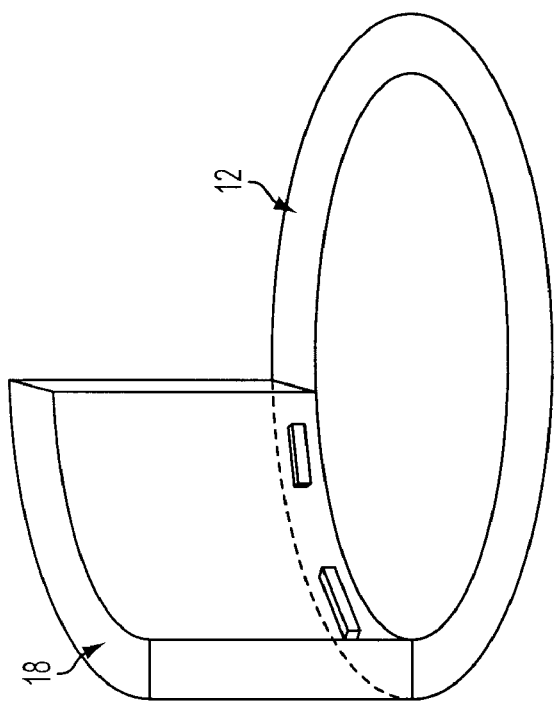
FIG. 3c is a perspective view of the structural ring interconnect printed circuit board connected to a pod with a printed circuit board and connectors attached on the pod's bottom side according to one embodiment.

In one embodiment, the structural ring interconnect printed circuit board assembly 10 further comprises at least one connector 20 on a surface of the printed circuit board 12, shown in FIGS. 2a-2b. As used herein, the at least one connector 20 may comprise a socket connector, a servo connector, a maintenance connector, or other type of connector known in the art. A connector 20 may be located on the top or bottom surface of the PCB 12 or act as an edge connector ninety degrees lateral to the PCB 12.

In one embodiment, the at least one connector 20 comprises at least one socket connector 30 on a surface of the PCB 12, shown in FIG. 2a. The at least one socket connector 30 may interact with a complementary connector on a PCB 12 that is attached either to a pod 18, shown in FIGS. 3a-3d, or to a vertical routing channel contained within a mechanical strut contained in the airframe skirt 16.

In one embodiment, the at least one connector 20 further comprises at least one servo socket connector 32 on a surface of the PCB 12, shown in FIG. 2b. The at least one servo socket connector 32 interacts with a complementary connector on a servo motor to control flight direction by manipulating the UAV's vanes.

In one embodiment, the PCB 12 comprises a plurality of layers. The appropriate number of PCB layers is based on the specific structural need, for example, the weight of the vehicle payload or size of the UAV. The exact number of layers can be calculated by performing a vehicle structural analysis using techniques known in the art.

In one embodiment, one or more of the plurality of layers is a ground plane to shield conductors from electromagnetic interference.

In one embodiment, the arc length of PCB 12 extends at least 180 degrees around the circumference of the airframe skirt 16, shown in FIGS. 2a-2b. The inner and outer walls 36, 34 of the airframe skirt 16 that do not contain or do not abut the PCB 12 can be thickened with a lightweight material, such as a carbon fiber composite, to maintain the vehicle's structural rigidity. Under this embodiment, the PCB 12 still remains a lighter weight alternative to wire harnesses and structural rigidity is still achieved.

In one embodiment, the arc length of the PCB 12 extends 360 degrees around the circumference of the airframe skirt 16, shown in FIGS. 1a-1c.

In one embodiment, the PCB 12 is attached to and supported by a plurality of v-blocks 38 contained in the airframe skirt 16, as shown in FIGS. 1a-1b. As used herein, the v-blocks 38 are lightweight supports or placeholders on which the PCB 12 rests during and after assembly. The PCB 12 may be attached to the v-blocks 38 via glue or screws 48, for example, or alternatively, the v-blocks 38 may simply act as passive supports while the PCB is attached to the walls of the airframe skirt. The v-blocks 38 may be formed as part of the molding of the airframe skirt 16. Alternatively, the v-blocks 38 may be separate components placed within the airframe skirt. Regardless of whether the v-blocks 38 are molded as part of the airframe skirt or are separate components, the v-blocks 38 are considered to be part of the core vehicle body 14. The v-blocks 38 extend from the point where the inner and outer duct wall meet and fuse together up toward the opening of the airframe skirt's "V." The exact height of the v-blocks 38 is dictated by the thickness and number of layers of the PCB 12.

In one embodiment, one of the at least one socket connector 30 is a power supply socket 40, as shown in FIG. 2a. As used herein, the power supply socket 40 may interact with a complementary connector attached to a pod 18 or to a power filter housing residing in the airframe skirt 16.

In one embodiment, the structural ring interconnect printed circuit board assembly 10 further comprises a radio socket connector 42 on a surface of the PCB 12, as shown in FIG. 2b. As used herein, the radio socket connector 42 may interact with a complementary connector attached to a radio.

In one embodiment, the structural ring interconnect printed circuit board assembly 10 further comprises an antenna coaxial cable connector 44 on a surface of the PCB 12, as shown in FIG. 2b. As used herein, the antenna coaxial cable connector may interact with a complementary connector attached to an antenna 46.

In one embodiment, the PCB 12 is either rigid or rigid-flex. As used herein, the standard fiberglass material used in PCB rigid or rigid-flex may be tailored for a UAV's specific structural need based on a vehicle structural analysis conducted according to known techniques. In order to incorporate additional strength, a layer of carbon fiber can be added to the PCB 12 or carbon fiber can be added directly into the prepreg material.

In one embodiment, the PCB's prepreg material is FR-4. FR-4, an abbreviation for Flame Retardant 4, is a type of material used for making a PCB 12. FR-4 describes the board itself with no copper covering. The FR-4 used in PCBs 12 is typically UV stabilized with a tetrafunctional epoxy resin system. FR-4 is typically a yellowish color. FR-4 that is manufactured strictly as an insulator (without copper cladding) is typically a difunctional epoxy resin system and a greenish color. FR-4 is similar to an older material called G-10. G-10 lacked FR-4's self-extinguishing flammability-characteristics. FR-4 has widely replaced G-10 in most applications. Some military applications where destruction of the circuit board is a desirable trait will still utilize G-10.

A PCB 12 needs to be an insulator to avoid shorting the circuit, physically strong to protect the copper tracks placed upon it, and to have certain other physical electrical qualities. FR-4 is preferred over cheaper alternatives such as synthetic resin bonded paper due to several mechanical and electrical properties; it is less lossy at high frequencies, absorbs less moisture, has greater strength and stiffness and is highly flame resistant compared to its less costly counterpart. FR-4 is widely used to build high-end consumer, industrial, and military electronic equipment and is also ultra high vacuum (UHV) compatible.

In one embodiment, the ground plane is a carbon fiber skin composite.

As used herein, all the foregoing descriptions and embodiments with respect to the first aspect are equally applicable to the following second aspect as well. Furthermore, all embodiments disclosed for each aspect may be combined with other embodiments.

In a second aspect, the present invention provides a structural ring interconnect printed circuit board assembly 10 for a ducted fan unmanned aerial vehicle that comprises a plurality of printed circuit boards 12 attached to a core vehicle body 14, wherein each of the plurality of printed circuit boards 12 conforms to the shape of the airframe skirt 16 of the core vehicle body 14, and wherein each of the plurality of the printed circuit boards 12 provides structural integrity to the core vehicle body 14.

As used herein, the plurality of PCBs 12 are spaced around the circumference of the airframe skirt 16 based on the specific UAV needs. The plurality of PCBs 12 may combine to form a 360 degree PCB 12 or may alternatively contain spaces in between. Where there are spaces between the plurality of PCBs 12, the inner and outer walls 36, 34 of the airframe skirt that do not contain or do not abut a PCB 12 can be thickened with a lightweight material, such as a carbon fiber composite, to maintain the vehicle's structural rigidity. Under this embodiment, the PCB 12 still remains a lighter weight alternative to wire harnesses and structural rigidity is still achieved.

In one embodiment, the arc length of each of the plurality of PCBs 12 extends between 45 and 90 degrees around the circumference of the airframe skirt 16.

In one embodiment, the inner and outer duct walls 36, 34 of the airframe skirt 16 are thicker in sections of the airframe skirt 16 in spaces between each of the plurality of PCBs 12.

In one embodiment, the structural ring interconnect printed circuit board assembly 10 further comprises at least one connector 20 on a surface of each of the plurality of PCBs 12.

In one embodiment, the at least one connector 20 comprises at least one socket connector 30 on a surface of the PCB 12. The at least one socket connector 30 may interact with a complementary connector on a PCB 12 that is attached either to a pod 18 or to a harness route channel, such as a stator or engine mounting strut contained in the airframe skirt 16.

The invention claimed is:

1. A ducted fan unmanned aerial vehicle (UAV) comprising a structural ring interconnect printed circuit board assembly, the UAV comprising:
   an annular duct one end of which comprises an airframe skirt; and
   a ring-shaped printed circuit board attached to the airframe skirt, wherein the printed circuit board conforms to the shape of the airframe skirt, and wherein the printed circuit board is configured to increase structural integrity of the airframe skirt when attached thereto.

2. The UAV of claim 1 further comprising at least one connector on a surface of the printed circuit board.

3. The UAV of claim 2, wherein the at least one connector comprises at least one socket connector on a surface of the printed circuit board or at least one servo socket connector on the surface of the printed circuit board.

4. The UAV of claim 3, wherein one of the at least one socket connector comprises at least one of a power supply socket, a radio socket connector, or an antenna coaxial cable connector.

5. The UAV of claim 1, wherein the printed circuit board comprises a plurality of layers and wherein one or more of the plurality of layers is a ground plane configured to shield conductors from electromagnetic interference.

6. The UAV of claim 5, wherein the ground plane is a carbon fiber skin composite.

7. The UAV of claim 1, wherein an arc length of the printed circuit board extends at least 180 degrees around a circumference of the airframe skirt.

8. The UAV of claim 7, wherein the arc length of the printed circuit board extends 360 degrees around the circumference of the airframe skirt.

9. The UAV of claim 1, wherein the printed circuit board is attached to and supported by a plurality of v-blocks contained in the airframe skirt.

10. The UAV of claim 1, wherein the printed circuit board is either rigid or rigid-flex.

11. The UAV of claim 1, further comprising a plurality of payload pods connected to the airframe skirt to form at least a portion of the annular duct of the UAV.

12. The UAV of claim 1,
wherein each of the plurality of payload pods comprise at least one electronic component,
wherein the printed circuit board comprises a plurality of connectors configured to connect electronic components of the plurality of payload pods, and
wherein the printed circuit board forms a platform on which the plurality of payload pods are arranged to connect the electronic components of the plurality of payload pods via the plurality of connectors of the printed circuit board.

13. The UAV of claim 1,
wherein the airframe skirt comprises a generally v-shaped shell comprising a first wall arranged radially inward from a second wall,
wherein a first end of the first wall is connected to a first end of the second wall, and
wherein the printed circuit board connects the first wall to the second wall distal to the first ends of each wall.

14. The UAV of claim 1, wherein an outer edge of the printed circuit board substantially matches an outer wall of the airframe skirt and wherein an inner edge of the printed circuit board abuts an inner wall of the airframe skirt.

15. A structural ring interconnect printed circuit board assembly for a ducted fan unmanned aerial vehicle (UAV), the structural ring interconnect printed circuit board comprising:
a plurality of arcuate printed circuit boards configured to be attached to an airframe skirt of the UAV, wherein the airframe skirt defines at least a portion of one end of an annular duct of the UAV, wherein each of the plurality of printed circuit boards conforms to the shape of the airframe skirt and the plurality of printed circuit boards are configured to form a ring-shape when arranged together and connected to the airframe skirt, and wherein each of the plurality of the printed circuit boards is configured to increase structural integrity of the airframe skirt when attached thereto.

16. The structural ring interconnect printed circuit board assembly of claim 15, wherein an arc length of each of the plurality of printed circuit boards extends between 45 and 90 degrees around a circumference of the airframe skirt.

17. The structural ring interconnect printed circuit board assembly of claim 15, wherein an inner wall and an outer wall of the airframe skirt are thicker in sections of the airframe skirt corresponding to spaces between each of the plurality of printed circuit boards.

18. The structural ring interconnect printed circuit board assembly of claim 15 further comprising at least one connector on a surface of each of the plurality of printed circuit boards.

19. The structural ring interconnect printed circuit board assembly of claim 18, wherein the at least one connector comprises at least one socket connector on a surface of at least one of the plurality of printed circuit boards.

20. An unmanned aerial vehicle comprising:
a ducted fan comprising a duct, wherein one end of the duct comprises a core vehicle body comprising an air frame skirt;
a plurality of payload pods connected to the core vehicle to form the duct; and
a printed circuit board attached the core vehicle body, wherein the printed circuit board conforms to a shape of the airframe skirt, and wherein the printed circuit board is configured to increase structural integrity of the airframe skirt when attached to the core vehicle body.

* * * * *